United States Patent
Miyama et al.

[11] Patent Number: 5,900,748
[45] Date of Patent: May 4, 1999

[54] VOLTAGE COMPARATOR

[75] Inventors: Ryuji Miyama, Tenri; Kunihiko Iizuka, Sakurai; Kazuo Hashiguchi, Shiki-gun, all of Japan

[73] Assignee: Sharp Kabushiki Kaisha, Osaka, Japan

[21] Appl. No.: 08/969,551

[22] Filed: Nov. 13, 1997

[30] Foreign Application Priority Data

Nov. 13, 1996 [JP] Japan ..................................... 8-302158

[51] Int. Cl.⁶ .................................................. H03K 5/22
[52] U.S. Cl. ............................................. 327/65; 327/562
[58] Field of Search .................................. 327/52, 63, 65, 327/560, 562, 563, 198, 379, 382

[56] References Cited

U.S. PATENT DOCUMENTS

| | | | |
|---|---|---|---|
| 4,703,249 | 10/1987 | De La Plaza | 323/316 |
| 4,763,021 | 8/1988 | Stickel | 307/475 |
| 4,868,483 | 9/1989 | Tsujimoto | 323/313 |
| 4,930,112 | 5/1990 | Tanaka | 365/226 |
| 5,061,862 | 10/1991 | Tamagawa | 307/296.7 |
| 5,063,304 | 11/1991 | Iyenger | 307/296.6 |

FOREIGN PATENT DOCUMENTS 62-043913  2/1987  Japan .

OTHER PUBLICATIONS

Gregorian, et al; A Continuously Variable Slope Adaptive Delta Modulation Codec System; IEEE Journal of Solid-State Circuits, vol. SC-18, No. 6; Dec. 1983; pp. 692–700.

*Primary Examiner*—Timothy P. Callahan
*Assistant Examiner*—Maria Hasanzadah

[57] ABSTRACT

In a voltage comparator of the present invention, across a gate and a source of an amplifier transistor, a phase compensating capacitor and a first switch circuit are connected with each other in series, and a second switch circuit for short-circuiting the phase compensating capacitor is provided. The second switch circuit is turned on when the first switch circuit is turned off so as to (1) short-circuit the phase compensating capacitor and (2) discharge the phase compensating capacitor which has been charged while the first switch circuit was turned on. This permits to completely turn off the first switch circuit, and to prevent distortion of an output signal outputted from an output terminal, thereby preventing accumulation of unnecessary charges in the phase compensating capacitor.

5 Claims, 6 Drawing Sheets

VOLTAGE COMPARATOR

FIELD OF THE INVENTION

The present invention relates to a voltage comparator, provided with a phase compensating capacitor for preventing oscillation, which compares two voltages by outputting a signal in accordance with a difference between the two voltages.

BACKGROUND OF THE INVENTION

A conventional voltage comparator is provided with, for example, as shown in FIG. 4, a plus-side input terminal 1, a minus-side input terminal 2, an output terminal 3, and a differential amplifier 20 composed of MOS transistors 21 through 24. The following will describe the operation of the above-mentioned members.

In general, in a voltage comparator, when the potential of the plus-side input terminal 1 is $V_{IN1}$, the potential of the minus-side input terminal 2 is $V_{IN2}$. power source potentials are respectively $V_{DD}$ and $V_{SS}$, and the gain of the voltage comparator as an amplifier circuit is G, an output voltage $V_{OUT}$ generated at the output terminal 3 is given by the equation:

$$V_{OUT} = G\{(V_{IN1} - V_{IN2})\} + V_{REF}$$

Note that, the $V_{REF}$ in the equation is generally referred to as a reference voltage. The reference voltage $V_{REF}$ normally takes a potential value of a medium of the power source potentials $V_{DD}$ and $V_{SS}$.

$$V_{REF} = (V_{DD} - V_{SS})/2$$

However, the reference voltage $V_{REF}$ may take a value different from the specified one.

This allows a voltage in accordance with the difference between the two input terminals 1 and 2 to be outputted from the output terminal 3. In the case where the two inputs have the same potential, the reference voltage $V_{REF}$ is outputted.

However, in the case where an actual voltage comparator is not provided with an offset compensating circuit 10 of FIG. 4, when the properties of the MOS transistors 21 through 24 constituting the differential amplifier 20 are non-uniform, the reference voltage $V_{REF}$ is outputted even when the two input signals have different potentials. The difference of the two inputs are referred to as an offset voltage. When the offset voltage is $V_{OFF}$, the output when the offset voltage is generated is given by the equation (1):

$$V_{OUT} = G\{V_{IN1}(V_{IN2} + V_{OFF})\} + V_{REF} \quad (1)$$

When the offset voltage $V_{OFF}$ is generated, the output in accordance with the difference between the $V_{IN1}$ and $V_{IN2}$ is not obtained. This causes an operational error of the voltage comparator. Thus, it is desirable to suppress the generation of the offset voltage $V_{OFF}$.

In contrast, as shown in FIG. 4, the conventional voltage comparator is provided with the offset compensating circuit 10 for compensating the offset voltage. The offset compensating circuit 10 is provided in the preceding stage of the differential amplifier 20, and is provided with transfer switches 11 and 12. The transfer switch 11 transfers and outputs (1) the potential $V_{IN1}$ or (2) the reference voltage $V_{REF}$ from a reference voltage source 15. The transfer switch 12 transfers and outputs (a) the potential $V_{IN2}$ or (b) the reference voltage $V_{REF}$.

In the above voltage comparator, an offset compensating operation is carried out by the offset compensating circuit 10 prior to a voltage comparing operation.

In the offset compensating operation, first, the transfer switches 11 and 12 are respectively switched on the side of the reference voltage source 15, and an input-output switch 13 is turned on. The input-output switch 13 is provided on the output side of the transfer switch 12 via an offset compensating capacitor 14. Also, a high level control signal S is supplied from a control terminal 6 to a switch circuit 40 provided in an output stage of the voltage comparator. This turns on MOS transistors 41 and 42 constituting a transfer gate in the switch circuit 40.

Under these conditions, the reference voltage $V_{REF}$ is inputted to the input terminal 1 of the voltage comparator. Also, since the input-output switch 13 is turned on, the potential of the input terminal 2 takes the same value as the output potential of the output terminal 3. Namely, the following relations are established:

$$V_{IN1} = V_{REF}$$

$$V_{IN2} = V_{OUT}$$

These can be combined with the equation (1) so as to represent the output by the equation:

$$V_{OUT} = G\{V_{REF} - (V_{OUT} + V_{OFF})\} + V_{REF}$$
$$= V_{REF} - \{G/(1+G)\} \cdot V_{OFF}$$

Here, since G>1 in general, the term $\{G/(1+G)\} \approx 1$. Thus, the above equation can be simplified to:

$$V_{OUT} = V_{REF} - V_{OFF}$$

Specifically, as shown in FIG. 4, the potential of the terminal of the offset compensating capacitor 14 on the side of the differential amplifier 20, namely, the potential of a point $P_3$ is $V_{REF} - V_{OFF}$, and the potential of the terminal of the offset compensating capacitor 14 on the side of the transfer switch 12, namely, the potential of a point $P_4$ is $V_{REF}$. Thus, the offset compensating capacitor 14 accumulates a charge in accordance with $V_{OFF}$ which is a potential difference across the offset compensating capacitor 14. Here, when $V_{OFF} > 0$, the potential of the point $P_3$ becomes lower than the potential of the point $P_4$ by the amount of $V_{OFF}$, and when $V_{OFF} < 0$, the potential of the point $P_3$ becomes higher than the potential of the point $P_4$ by the amount of $V_{OFF}$.

In the offset compensating operation, the voltage comparator functions as an operational amplifier. Thus, by turning on the switch circuit 40 so as to connect a phase compensating capacitor 32 between the input and the output of an amplifier transistor 31, the generation of oscillation can be suppressed, thereby permitting to stabilize the operation of the voltage comparator functioning as the operational amplifier.

After the offset compensating operation is carried out in the described manner, the voltage comparing operation is carried out. When the operation of the voltage comparator is shifted to the voltage comparing operation, the transfer switches 11 and 12 are respectively switched on respective sides of the input terminals 1 and 2, the input-output switch 13 is turned off, and the control signal S becomes a low level.

Here, because a charge for the amount of $V_{OFF}$ is accumulated in the offset compensating capacitor 14, when the potentials $V_{IN1}$ and $V_{IN2}$ are respectively supplied, as inputs for the voltage comparator, to the input terminals 1 and 2, the potential ($V_{IN2}-V_{OFF}$) is supplied to the input terminal 2 equivalently. Thus, in this case, the output is given by the equation:

$$V_{OUT} = G\{V_{IN1} - (V_{IN2} - V_{OFF} + V_{OFF})\} + V_{REF}$$
$$= G(V_{IN1} - V_{IN2}) + V_{REF}$$

As described, by providing the voltage comparator with the offset compensating circuit 10, it is possible to cancel the error of the output voltage due to the offset voltage.

Also, in the voltage comparing operation, by turning off the switch circuit 40 so as to disconnect the phase compensating capacitor 32 from the input and the output of the amplifier transistor 31, it is possible to widen a frequency band, and to increase the operation speed.

Note that, Japanese Unexamined Patent publication No. 43913/1987 (Tokukaishou 62-43913) discloses (1) the function as the operational amplifier and as the voltage comparator and (2) the phase compensating capacitor 32 and the switch circuit 40. The offset compensation, the phase compensating capacitor 32, and the switch circuit 40 are also disclosed in "A Continuously Variable Slope Adaptive Delta Modulation Codec System" in IEEE JOURNAL OF SOLID-STATE CIRCUITS, VOL. SC-18, NO. 6, DECEMBER 1983 p.698.

In the case where the circuit of FIG. 4 is adopted as the voltage comparator, there is a case where the switch circuit 40 cannot be turned off even when the control signal S is made a low level in order to turn off the switch circuit 40. In such a case, it is possible that the distortion of the output $V_{OUT}$ is caused. The following will describe such a case in detail.

In the case where, for example, the power source voltage $V_{DD}$ supplied to a power source terminal 4 is 3 V, the power source voltage $V_{SS}$ supplied to a power source terminal 5 is 0 V, and the reference voltage $V_{REF}$ is 1.5 V, for the offset compensating operation, when the transfer switches 11 and 12 are respectively switched on the side of the reference voltage source 15, the input-output switch 13 is turned on, and the control signal S is a high level, the potential of the terminal of the phase compensating capacitor 32 on the side of the switch circuit 40, namely, the potential of a point $P_1$ becomes substantially 1.5 V ($V_{REF}-V_{OFF}$).

Here, when the potential of the phase compensating capacitor 32 on the side of the output terminal of the differential amplifier 20, namely, the potential of a point $P_2$ is, for example, 0.8 V, a potential difference of 0.7 V is generated across the phase compensating capacitor 32. For this reason, a charge in accordance with the potential difference is accumulated in the phase compensating capacitor 32. This makes the potential of the point $P_1$ higher than the potential of the point $P_2$ by the amount of 0.7 V.

Further, when the operation of the voltage comparator is then shifted to the voltage comparing operation by making the switch control signal S a low level such that the potential of the point $P_2$ becomes 2.8 V when the input of the input terminal 1 is larger than the input of the input terminal 2, because the potential difference of 0.7 V is also generated in this case across the phase compensating capacitor 32, the potential of the point $P_1$ becomes 3.5 V.

A P-type MOS transistor 42 constituting the switch circuit 40 has a structure shown in FIG. 5. In the case where the MOS transistor 42 is to be provided on a P-type wafer substrate 60, the MOS transistor 42 is formed on a region of an N-well 61. In this case, because the low level control signal S is inverted by an inverter 34 so as to be inputted, a voltage of 3 V is applied to the gate electrode of the MOS transistor 42. Also, as mentioned above, the potential of the terminal of the MOS transistor 42 connected to the point $P_1$ is 3.5 V. This makes the potential of the terminal of $P_1$ higher than the potential of the gate electrode, thereby turning on the MOS transistor 42 (although not completely necessarily).

As described, in the case where the circuit of FIG. 4 is adopted as the voltage comparator, there is a case where the MOS transistor 42 is not turned off completely even when the switch control signal S is made a low level in order to turn off the switch circuit 40. In such a case, the switch circuit 40 is not turned off completely.

In the case where the switch circuit 40 is not turned off completely, the current from a constant current source 33 flows to the switch circuit 40. This distorts the output signal of the output terminal 3. For example, as shown in FIG. 6, in the case where the output signal of the differential amplifier 20 has a waveform which rises from $V_1$ to $V_2$ at a time $T_1$, the actual signal outputted from the output terminal 3 has a distorted waveform which does not rise spontaneously from $V_3$ to $V_4$, as shown by the curve in FIG. 7.

SUMMARY OF THE INVENTION

It is an object of the present invention to provide a voltage comparator in which accumulation of unnecessary charges in the phase compensating capacitor can be prevented.

In order to achieve the above-mentioned object, a voltage comparator of the present invention includes:

a differential amplifier for outputting a signal in accordance with a difference between a first input signal and a second input signal;

an amplifier transistor for amplifying an output signal of the differential amplifier;

a phase compensating capacitor provided across an input and an output of the amplifier transistor;

a connection-disconnection switch for (1) connecting the phase compensating capacitor across the input and the output of the amplifier transistor and (2) disconnecting the phase compensating capacitor from the input and the output of the amplifier transistor;

an offset compensating circuit for compensating an offset component of an output signal of the amplifier transistor; and a short-circuit switch for short-circuiting the phase compensating capacitor.

With this arrangement, the phase compensating capacitor is connected, by the connection-disconnection switch, between the input and the output of the amplifier transistor when phase compensation is required, whereas the phase compensating capacitor is disconnected from the input and the output of the amplifier transistor when phase compensation is not required. Even when the phase compensating capacitor is disconnected from the input and the output of the amplifier transistor, a charge which has accumulated while the phase compensating capacitor is in connection still remains in the phase compensating capacitor. However, when the phase compensating capacitor are short-circuited by the short-circuit switch, the accumulated charge in the phase compensating capacitor can be released. Thus, when carrying out the voltage comparing operation of the voltage comparator, by making a control signal, which controls the operation of the connection-disconnection switch, for example, a low level, so as to turn off the connection-disconnection switch, it is possible to turn off the connection-disconnection switch completely, thereby preventing the output signal of the voltage comparator from being distorted.

In the voltage comparator of the present invention, it is preferable that the short-circuit switch releases the short-circuiting of the phase compensating capacitor in synchronism with a connecting operation of the connection-disconnection switch, whereas the short-circuit switch short-circuits the phase compensating capacitor in synchronism with a disconnecting operation of the connection-disconnection switch.

With this arrangement, when the phase compensating capacitor is in connection by the connection-disconnection switch, the short-circuiting of the phase compensating capacitor is released by the short-circuit switch, whereas when the phase compensating capacitor is in disconnection by the connection-disconnection switch, the phase compensating capacitor is short-circuited by the short-circuit switch. Thus, since the short-circuit switch is operated in synchronism with the operation of the connection-disconnection switch, it is possible to adopt a common control system for the short-circuit switch and the connection-disconnection switch.

For a fuller understanding of the nature and advantages of the invention, reference should be made to the ensuing detailed description taken in conjunction with the accompanying drawings.

DESCRIPTION OF THE EMBODIMENTS

Figure 1:
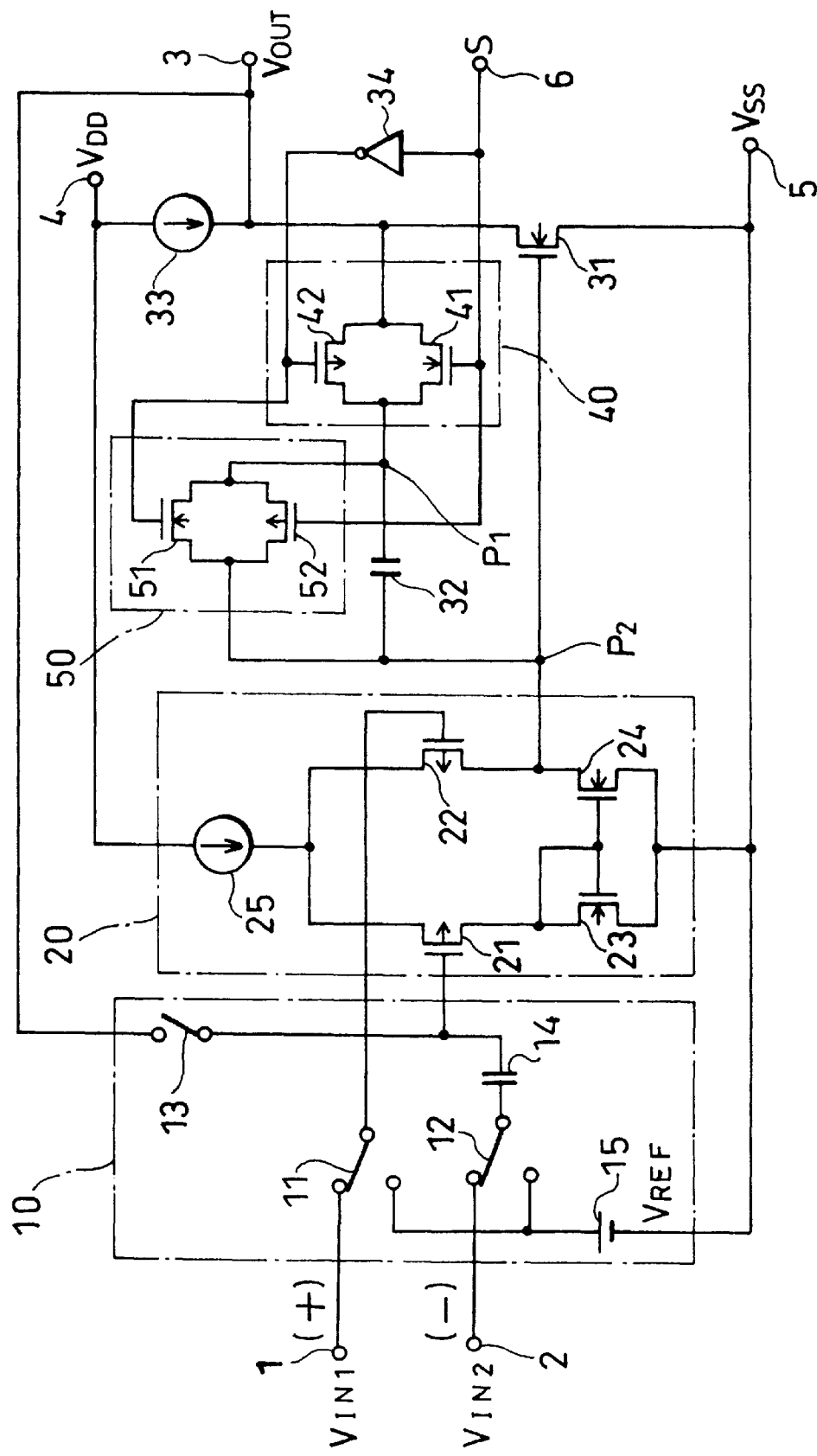
FIG. 1 is a circuit diagram showing a structure of a voltage comparator in accordance with one embodiment of the present invention.
Figure 2:
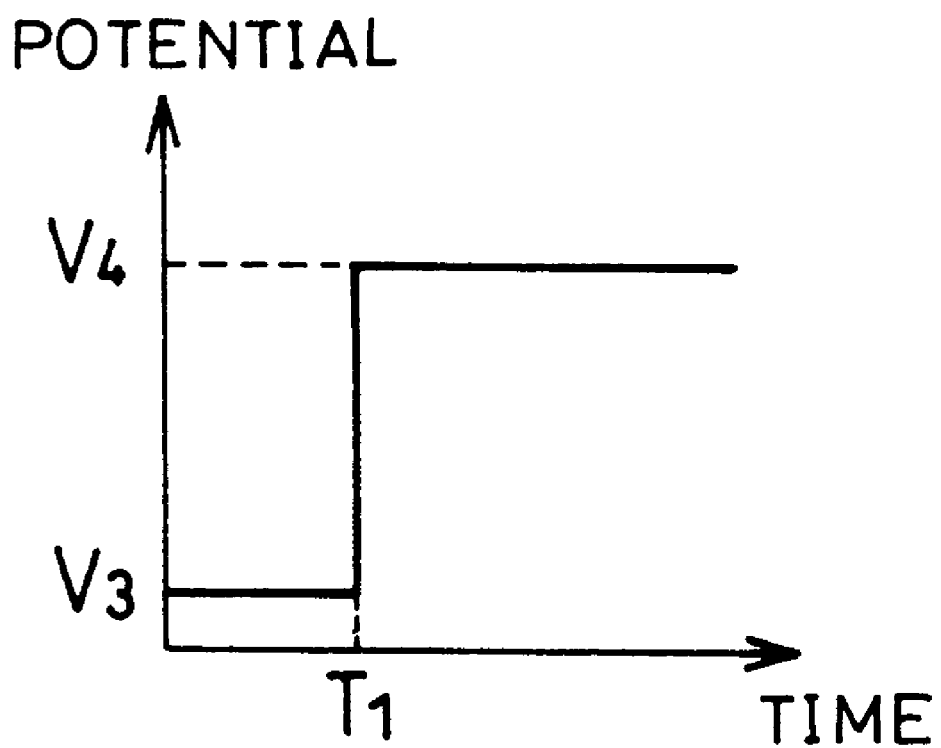
FIG. 2 is a waveform chart showing a waveform of an output signal outputted from an output terminal of the voltage comparator.
Figure 3:
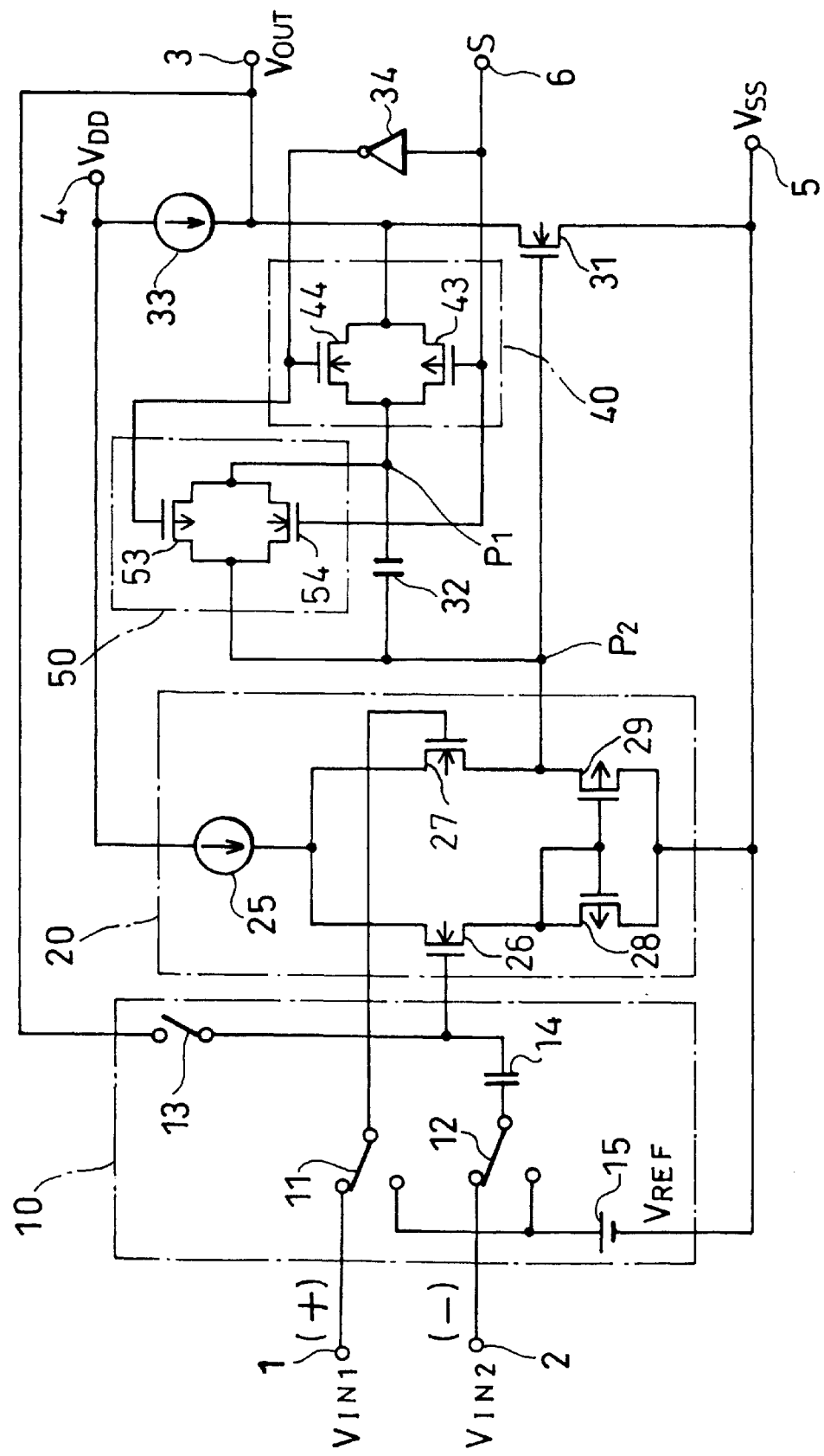
FIG. 3 is a circuit diagram showing a structure of another voltage comparator in accordance with the embodiment of the present invention.
Figure 4:
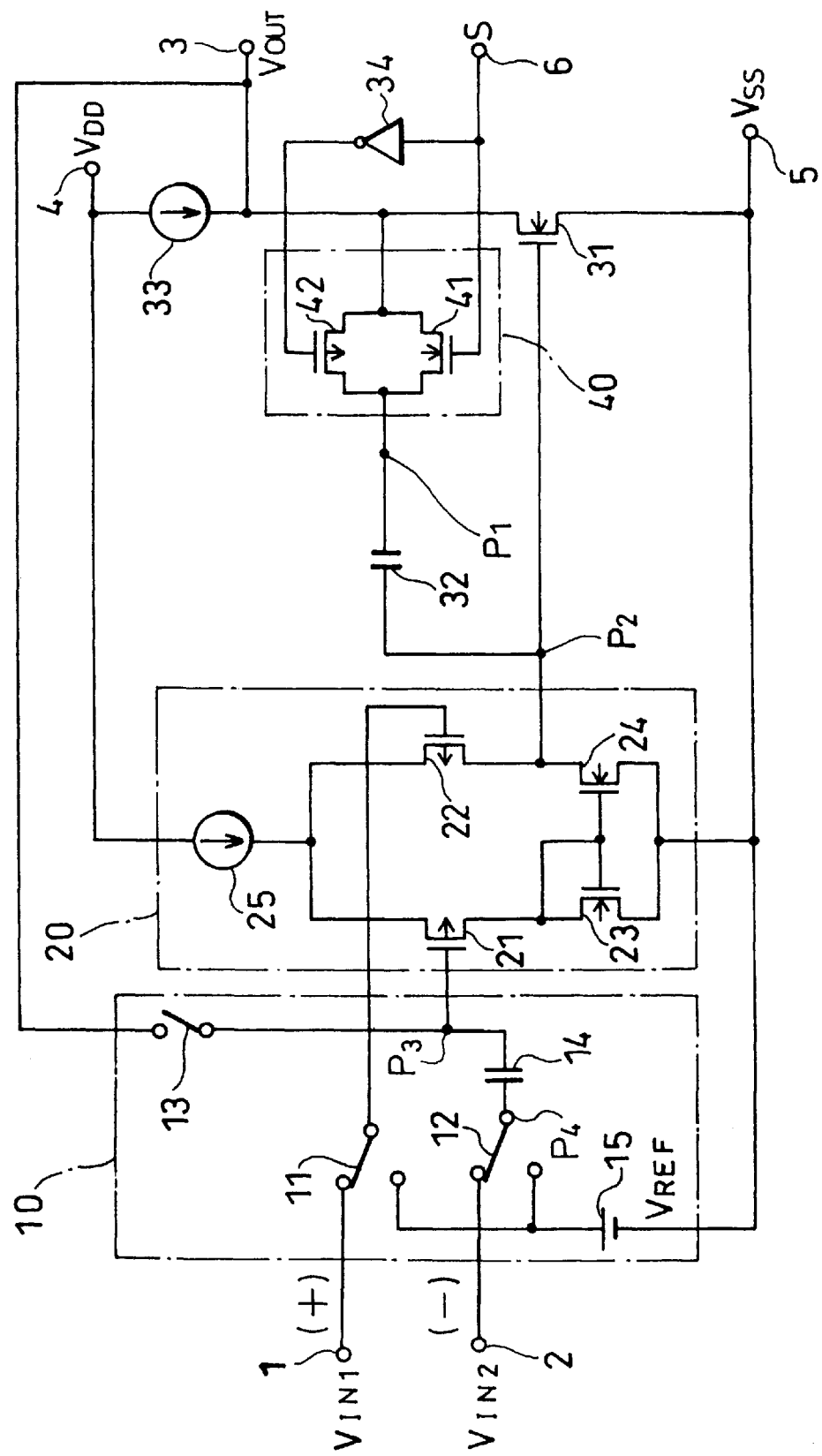
FIG. 4 is a circuit diagram showing a structure of a conventional voltage comparator.
Figure 5:
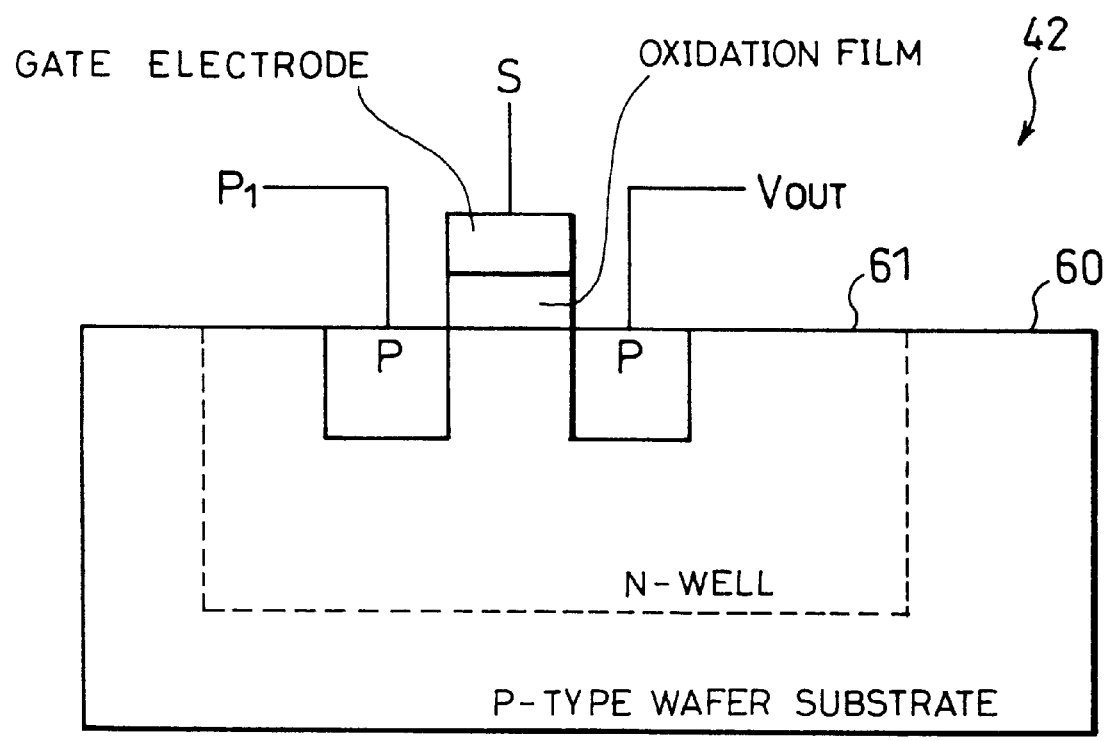
FIG. 5 is a cross sectional view showing a structure of a P-MOS transistor of a switch circuit provided in the voltage comparator of FIG. 4.
Figure 6:
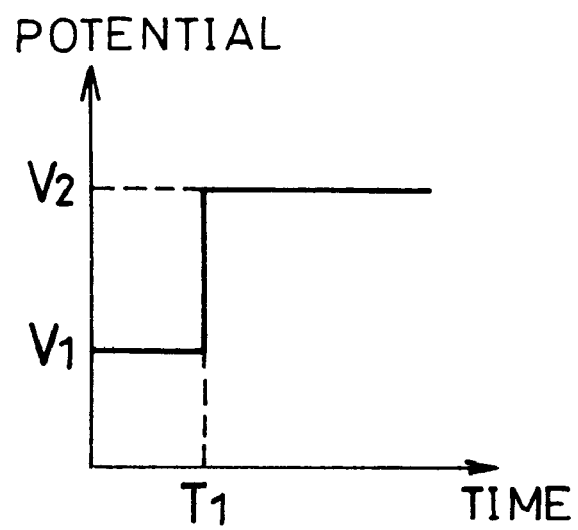
FIG. 6 is a waveform chart showing a waveform of an output signal from a differential amplifier of the voltage comparator of FIG. 4.

The following will describe one embodiment of the present invention referring to FIG. 1 through FIG. 3. Note that, in the present embodiment, members having the same functions as the members of a conventional voltage comparator of FIG. 4 are given the same reference numerals.

As shown in FIG. 1, a voltage comparator of the present embodiment is provided with a plus-side input terminal 1, a minus-side input terminal 2, an output terminal 3, power source terminals 4 and 5 respectively supplied with power source voltages $V_{DD}$ and $V_{SS}$, and a control terminal 6 which receives a control signal S. The voltage comparator of the present embodiment is further provided with an offset compensating circuit 10, a differential amplifier 20, an amplifier transistor 31, a phase compensating capacitor 32, a constant current source 33, an inverter 34, and switch circuits 40 and 50.

The offset compensating circuit 10 is provided with transfer switches 11 and 12, an input-output switch 13, an offset compensating capacitor 14, and a reference voltage source 15.

The transfer switch 11 transfers and outputs (1) an input signal inputted from the input terminal 1 or (2) a reference voltage $V_{REF}$ generated by the reference voltage source 15. The transfer switch 12 transfers and outputs, to the offset compensating capacitor 14, (a) an input signal inputted from the input terminal 2 or (b) the reference voltage $V_{REF}$.

The input-output switch 13 is provided between the terminal of the offset compensating capacitor 14 and the output terminal 3. The input-output switch 13 is turned on when both of the transfer switches 11 and 12 are switched on the side of the reference voltage source 15, and the input-output switch 13 is turned off when the transfer switches 11 and 12 are respectively switched on respective sides of the input terminals 1 and 2.

The differential amplifier 20 is provided with P-type MOS transistors (hereinafter referred to as P-MOS transistors) 21 and 22, N-type MOS transistors (hereinafter referred to as N-MOS transistors) 23 and 24, and a constant current source 25.

The gate of the P-MOS transistor 21 is connected to the terminal of the offset compensating capacitor 14 on the side of the input-output switch 13, and the gate of the P-MOS transistor 22 is connected to the output terminal of the transfer switch 11. Also, the respective sources of the P-MOS transistors 21 and 22 are connected to the output terminal of the constant current source 25. On the other hand, the drains of the N-MOS transistors 23 and 24 are respectively connected to the drains of P-MOS transistors 21 and 22, and the respective sources of the N-MOS transistors 23 and 24 are connected to the power source terminal 5. Also, the gate of the N-MOS transistor 23 is connected to the source of the N-MOS transistor 23 and the gate of the N-MOS transistor 24. The input terminal of the constant current source 25 is connected to the power source terminal 4.

The amplifier transistor 31 is an N-type MOS transistor. The gate of the amplifier transistor 31 is connected to the output terminal of the differential amplifier 20. Namely, the gate of the amplifier transistor 31 is connected to the junction (drain) of the P-MOS transistor 22 and the N-MOS transistor 24. Also, the drain and the source of the amplifier transistor 31 are respectively connected to the output terminal of the constant current source 33 and the power source terminal 5. The input terminal of the constant current source 33 is connected to the power source terminal 4.

The phase compensating capacitor 32 and the switch circuit 40 are connected with each other in series across the gate and the drain of the amplifier transistor 31. Also, the switch circuit 50 is connected in parallel with the phase compensating capacitor 32. One terminal of the phase compensating capacitor 32 is connected to the output terminal of the differential amplifier 20, i.e., a point $P_2$, and the other terminal of the phase compensating capacitor 32 is connected to the input terminal of the switch circuit 40, i.e., a point $P_1$.

The switch circuit 40 as a connection-disconnection switch is so-called a transfer gate, wherein the N-MOS transistor 41 and the P-MOS transistor 42 are connected in parallel. The gate of the N-MOS transistor 41 is connected to the control terminal 6, and the gate of the P-MOS transistor 42 is connected to the control terminal 6 via the inverter 34. Also, the drain of the N-MOS transistor 41 and the source of the P-MOS transistor 42 are connected to the point $P_1$. The source of the N-MOS transistor 41 and the drain of the P-MOS transistor 42 are connected to the drain of the amplifier transistor 31.

The switch circuit 50 as a short-circuit switch is also a transfer gate, wherein the N-MOS transistor 51 and the P-MOS transistor 52 are connected in parallel. The drain of the N-MOS transistor 51 and the source of the P-MOS transistor 52 are connected to the point $P_2$. Also, the source of the N-MOS transistor 51 and the drain of the P-MOS transistor 52 are connected to the point $P_1$.

In the voltage comparator having the described arrangement, an offset compensating operation is carried out prior to a voltage comparing operation. The offset compensating operation is similar to the offset compensating operation of the conventional voltage comparator (see FIG. 4) in that the offset compensating operation of the present embodiment functions under the conditions wherein the transfer switches 11 and 12 are both switched on the side of the reference voltage source 15, and the input-output switch 13 is turned on. Also, in the offset compensating operation, since the control signal S becomes a high level, the switch circuit 40 is turned on.

Here, the offset compensating capacitor 14 accumulates an excess charge for the potential of an offset voltage $V_{OFF}$. Also, in the offset compensating operation, since the switch circuit 50 is turned off by the control signal S, the phase compensating capacitor 32 is connected across the input and the output of the amplifier transistor 31 via the switch circuit 40. Thus, the generation of oscillation is suppressed by the phase compensating capacitor 32, thereby stabilizing the operation of the voltage comparator.

In the case where the operation of the voltage comparator is shifted from the offset compensating operation to the voltage comparing operation, the transfer switches 11 and 12 are respectively switched on the respective sides of the input terminals 1 and 2, the input-output switch 13 is turned off, and the control signal S becomes a low level. This turns off the switch circuit 40, and turns on the switch circuit 50.

Under these conditions, when potentials $V_{IN1}$ and $V_{IN2}$ are supplied respectively to the input terminals 1 and 2, the potential of the input terminal 2 takes a value obtained by subtracting (a) the offset voltage $V_{OFF}$ charged in the offset compensating capacitor 14 from (b) the potential $V_{IN2}$, thereby offsetting an offset component of the output voltage $V_{OUT}$ which is transferred to the output terminal 3 via the differential amplifier 20 and the amplifier transistor 31.

Further, by turning off the switch circuit 40, the phase compensating capacitor 32 is disconnected from the input and the output of the amplifier transistor 31. This widens the frequency band of the voltage comparator, and increases the operation speed. Here, by turning on the switch circuit 50, the phase compensating capacitor 32 is short-circuited such that the charge accumulated in the phase compensating capacitor 32 during the offset compensating operation is released. As a result, the both terminals of the phase compensating capacitor 32 have the same potential. This prevents the potential of the point $P_1$ from becoming higher than the gate voltage (high level potential of control signal S) of the P-MOS transistor 42. Therefore, the P-MOS transistor 42 is prevented from being turned on while the control signal S is a low level.

Figure 7:
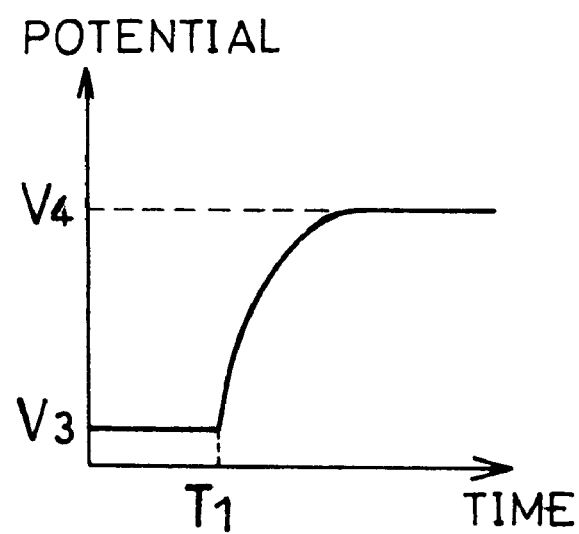
FIG. 7 is a waveform chart showing a waveform of an output signal, corresponding to the output signal of FIG. 6, outputted from an output terminal of a voltage comparator.

Thus, as shown in FIG. 2, unlike the output signal of the conventional voltage comparator (see FIG. 7), the output signal of the voltage comparator of the present embodiment has a waveform which is not distorted, thereby making it possible to stably operate the voltage comparator without being affected at all by the phase compensating capacitor 32. Further, since the output waveform is not distorted, the operation speed of the voltage comparator can be increased.

Also, the reference voltage $V_{REF}$ is normally set to have a potential value of a medium of the power source voltages $V_{DD}$ and $V_{SS}$. However, the value of the reference voltage $V_{REF}$ is not limited to the specified one, but the reference voltage $V_{REF}$ may have a value of any potential between the power source voltages $V_{DD}$ and $V_{SS}$. Even in the case of adopting such a reference voltage $V_{REF}$, the voltage comparator of the present embodiment can be operated in the described manner.

Note that, in the present embodiment, as shown in FIG. 3, even in the case where all the transistors 26 through 29, 43, 44, 53, and 54 provided on the voltage comparator are arranged so as to have the opposite polarities to the polarities (P type and N type) of the transistors 21 through 24, 41, 42, 51, and 52 of FIG. 1, it is also possible to stabilize the operation of the voltage comparator in the described manner. With this arrangement, as a control signal to be supplied to the switch circuit 40, such a signal is adopted which is prepared by inverting the control signal S in accordance with the polarities of the transistors. In the case of carrying out the voltage comparing operation with this arrangement, due to the short-circuit operation of the switch circuit 50, the potential of the point $P_1$ is prevented from becoming lower than the gate voltage of the N-MOS transistor. Thus, the switch circuit 40 is not turned on.

As described, the voltage comparator of the present invention has an arrangement wherein the phase compensating capacitor 32 is connected, via the switch circuit 40, across the input and the output of the amplifier transistor 31 which amplifies the output signal of the differential amplifier 20, and the voltage comparator of the present invention is provided with (1) the offset compensating circuit 10 for compensating the offset component of the output signal of the amplifier transistor 31 and (2) the switch circuit 50 for short-circuiting the phase compensating capacitor 32. Thus, when the phase compensating capacitor 32 is disconnected from the input and the output of the amplifier transistor by the switch circuit 50, a charge remaining in the phase compensating capacitor 32 is released. This allows to completely turn off the switch circuit 40 when the voltage comparing operation of the voltage comparator is carried out, thereby preventing the generation of distortion of the output signal of the voltage comparator.

With the described arrangement, it is possible to (1) improve the reliability of the operation of the voltage comparator and (2) increase the operation speed of the voltage comparator.

The switch circuit 50 of the voltage comparator is arranged so as to, preferably, (1) release the short-circuiting of the phase compensating capacitor 32 in synchronism with the connecting operation of the switch circuit 40 and (2) short-circuit the phase compensating capacitor 32 in synchronism with the disconnecting operation of the switch circuit 40, thereby permitting to adopt a common control system for the switch circuits 40 and 50. Thus, with this arrangement, it is possible to simplify the circuits.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A voltage comparator, comprising:
   a differential amplifier for outputting a signal in accordance with a difference between a first input signal and a second input signal;
   a transistor amplifier for amplifying an output signal of said differential amplifier;
   a phase compensating capacitor provided across an input and an output of said transistor amplifier;
   a connection-disconnection switch for (1) connecting said phase compensating capacitor across the input and the output of said transistor amplifier and (2) disconnecting said phase compensating capacitor from the input and the output of said transistor amplifier;
   an offset compensating circuit for compensating an offset component of an output signal of said transistor amplifier; and for providing the input signals to said differential amplifier
   a short-circuit switch controlled commonly with said connection-disconnection switch for short-circuiting said phase compensating capacitor.

2. The voltage comparator as set forth in claim 1, wherein said short-circuit switch releases short-circuiting of said phase compensating capacitor in synchronism with a connecting operation of said connection-disconnection switch, whereas said short-circuit switch short-circuits said phase compensating capacitor in synchronism with a disconnecting operation of said connection-disconnection switch.

3. The voltage comparator as set forth in claim 2, wherein:
   said connection-disconnection switch is composed of an N-type first MOS transistor and a P-type second MOS transistor connected with each other in parallel, said short-circuit switch is composed of an N-type third MOS transistor and a P-type fourth MOS transistor connected with each other in parallel, and
   respective gates of the first MOS transistor and the fourth MOS transistor are supplied with a same control signal, whereas respective gates of the second MOS transistor and the third MOS transistor are supplied with a same inverted signal of the control signal.

4. The voltage comparator as set forth in claim 1, further comprising:
   a first input terminal for receiving the first input signal;
   a second input terminal for receiving the second input signal; and
   an output terminal for outputting an output signal of said transistor amplifier,
   said offset compensating circuit including:
   a reference voltage source for generating a reference voltage;
   an offset compensating capacitor, connected to one input terminal of said differential amplifier, for accumulating a charge in accordance with the offset component;
   a first transfer switch for transferring and outputting the first input signal or the reference voltage to the other input terminal of said differential amplifier;
   a second transfer switch for transferring and outputting the second input signal or the reference voltage to said offset compensating capacitor; and
   an input-output switch for (1) connecting a terminal on a side of said differential amplifier and the output terminal and (2) disconnecting the terminal on the side of said differential amplifier from the output terminal, wherein said input-output terminal is in connection when said first transfer switch and said second transfer switch are both switched on a side of the reference voltage source, whereas said input-output terminal is in disconnection when said first transfer switch and said second transfer switch are respectively switched on respective sides of said first input terminal and said second input terminal.

5. The voltage comparator as set forth in claim 4, wherein said short-circuit switch releases short-circuiting of said phase compensating capacitor in synchronism with a connecting operation of said connection-disconnection switch while said input-output switch is in connection, whereas said short-circuit switch short-circuits said phase compensating capacitor in synchronism with a disconnecting operation of said connection-disconnection switch while said input-output signal is in disconnection.

* * * * *

UNITED STATES PATENT AND TRADEMARK OFFICE
CERTIFICATE OF CORRECTION

PATENT NO. : 5,900,748
DATED : May 4, 1999
INVENTOR(S) : Ryuji Miyama et al.

It is certified that error appears in the above-identified patent and that said Letters Patent is hereby corrected as shown below:

Column 9,
Line 18, after "fier" delete the ";".
Line 19, after "amplifier" add -- ; and --.

Signed and Sealed this

Twenty-first Day of May, 2002

Attest:

Attesting Officer

JAMES E. ROGAN
Director of the United States Patent and Trademark Office